United States Patent

[11] 3,571,675

[72] Inventor Werner Faust
Wettingen, Switzerland
[21] Appl. No. 860,844
[22] Filed Sept. 24, 1969
[45] Patented Mar. 23, 1971
[73] Assignee Aktiengesellschaft Brown, Boveri & Cie
Baden, Switzerland
[32] Priority Oct. 21, 1965
[33] Switzerland
[31] 14554

[54] CONTROLLED SEMI-CONDUCTOR WAFER HAVING ADJACENT LAYERS OF DIFFERENT DOPING CONCENTRATIONS AND CHARGED INSERT GRID
4 Claims, 6 Drawing Figs.

[52] U.S. Cl. .......... 317/235, 317/234, 307/304
[51] Int. Cl. .......... H01l 11/14
[50] Field of Search .......... 317/235.21.1; 235.48.1, 235 (official last 3 shoes, clerks desk, refile box)

[56] References Cited
UNITED STATES PATENTS

| | | | |
|---|---|---|---|
| 3,484,662 | 12/1969 | Hagon | 317/235 |
| 3,370,184 | 2/1968 | Zuleeg | 307/303 |

*Primary Examiner*—John W. Huckert
*Assistant Examiner*—Martin H. Edlow
*Attorney*—Pierce, Scheffler & Parker

ABSTRACT: A controlled semiconductor wafer includes at least one p-n junction and adjacently disposed layers of different doping concentration, there being a charged gridlike insert in the layer of lower doping concentration and located in the vicinity of the junction to the adjacent layer of higher doping concentration.

Figure 1:
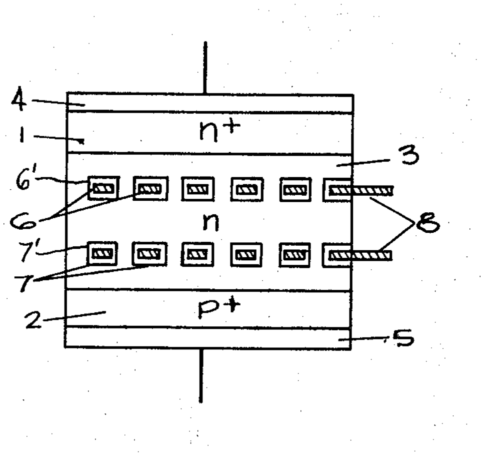

INVENTOR.
Werner Faust
BY
Pierce, Scheffler & Parker
Attorneys

INVENTOR.
Werner Faust
BY
Pierce, Scheffler & Parker
Attorneys

CONTROLLED SEMI-CONDUCTOR WAFER HAVING ADJACENT LAYERS OF DIFFERENT DOPING CONCENTRATIONS AND CHARGED INSERT GRID

This application is a continuation of Ser. No. 582,455, now abandoned.

This invention relates to an improvement in controllable semiconductor devices having several layers of different polarity, and the manufacture of such semiconductor devices.

Presently known transistors, thyristors and so on are constructed in such a way that semiconductors of differing polarity or conductivity type contact each other directly. Only the external connections for the leads are metallic. This construction has proved satisfactory for low powers to be conducted through the device, but with higher powers a switching delay is present which is disadvantageous, in particular with thyristors, i.e. controlled power rectifiers. Such apparatus cannot be used for the higher frequencies.

The possibility of controlling semiconductor devices arises from influencing the conductivity resulting from the movement of charge carriers. Conductivity is produced by doping the semiconductors to produce positive or negative charge carriers. One accordingly joins together P-type and N-type doped semiconductor parts. With transistors, a semiconductor of one conductivity type is used as a base between semiconductors of the opposite type. This base can then be used, by supplying electrical currents, for controlling the device by arranging that the charge carriers of different polarity are brought into movement as a result of the additional current, and then carry further current. The effect of the current introduced into the base layer propagates towards a stable state at finite speed. The full effect accordingly does not occur until after a determined period. This period, with small transistors, is so small that it is negligible. With larger units, however, e.g. with thyristors, it restricts the possibilities of use. When high frequency alternating current is used, this period is already so great that switching can no longer be performed in due order. Accordingly it is only possible to use the previously known thyristors with low frequencies. The reason for this is the low propagation speed of the control effect in the base of a transistor, or the gate or trigger electrode of a thyristor.

Accordingly the problem is to find a means which increases this propagation speed, and thereby allows the control effect to be established as quickly as possible.

It is known to use metallic electrodes. At a transition from metal to semiconductor a rectifying junction occurs, and accordingly metal layers can be used instead of semiconductors. One can then obtain an effect similar to the transistor (what is called a metal base transistor, see VDE Technical Report 1964, page 58). In this way it becomes possible to use transistors also for high frequencies. However, a disadvantage is that the metal must be extremely thin, which again precludes the use of large currents. Such metal base transistors are therefore not yet used in practice, but for the moment are only a theoretical possibility.

In order to obtain the advantage of greater propagation speed for controlled semiconductor devices and at the same time greater cross section for carrying larger currents, this invention proposes that, at least in one layer, at least one metallic insert piece shall be embedded.

The difficulty of putting such metallic insert pieces into a semiconductor is of course very great, since the semiconductor must be as far as possible monocrystalline. This is the reason why metal base transistors have not yet been introduced. The invention also provides a method showing how such intermediate layers can be produced comparatively simply. In accordance with this method, a mask is to be placed on a semiconductor wafer and further semiconductor material is to be vapor deposited; then after removal of the mask, metal is vapor-deposited, semiconductor material is again deposited and oxidized, then the surface is ground and further semiconductor material is vapor deposited.

In the accompanying drawings:

FIGS. 1 to 5 illustrate various semiconductor devices embodying the invention; and FIGS. 6*a* to 6*d* illustrate successive stages in the manufacture of devices embodying the invention.

In FIG. 1, a wafer of semiconductor material is shown, which works similarly to a controlled mercury vapor rectifier (mutator) and the various parts are given the same names as the corresponding parts of such a rectifier. The cathode is shown at 1, 2 is the anode. At the cathode is an $n$-type region i.e. a semiconductor region with negative charge carriers. At the anode is a $p$-type region containing "hole" equivalent to positive charges. In between lies the control layer 3. This is also an $n$-type layer. The difference between the two $n$ layers is that the $n$ layer at the cathode is low ohmic, i.e. is doped with a greater number of charge carriers than is the control layer. The low-ohmic layer is provided with the reference $n^+$. On the cathode and the anode lie the terminal electrodes 4 and 5, which consist of metal. In the high-ohmic $n$ layer 3, which has a lesser doping than layer 1, metallic insert pieces 6 and 7 are provided. The insert 6 lies in the vicinity of the $n^+/n$ junction or transition, the insert piece 7 in the vicinity of the $n/p^+$ junction. The metallic insert pieces have voltage supply connections 8. They are grid-shaped so that in the sectional representation of FIG. 1 the insert pieces appear interrupted. They are surrounded with an oxide layer 6′, 7′, for instance silicon oxide, to insulate them from the surrounding layers.

Movement of the charge carriers out of the low-ohmic $n^+$ region and consequent flooding of the high-ohmic $n$ region with charge carriers can now be prevented or assisted by the metallic control grid embedded in the $n$ region. A very short control time is obtained as the control can extend immediately uniformly over the whole surface of the $n$ region. The device of FIG. 1 works in the blocking direction like a diode. The grid on the cathode side receives negative potential like the cathode, and the grid on the anode side receives positive potential like the anode. Thereby the movement of electrons out of the low-ohmic $n^+$ region, and of holes out of the $pn$ junction, are prevented. The high-ohmic $n$ region acts like an insulator. The voltage drop occurs across the high-ohmic midlayer between the grids, and has almost uniform field strength, so that higher voltages can be blocked than with now known devices. If one reverses the polarity of the control electrodes in relation to cathode and anode with forward voltage stress, then the charge carriers immediately flood the high-resistance $n$ region from both sides and the device becomes conductive. By this measure the thickness of the wafer can be less than with known thyristors.

Figure 2:
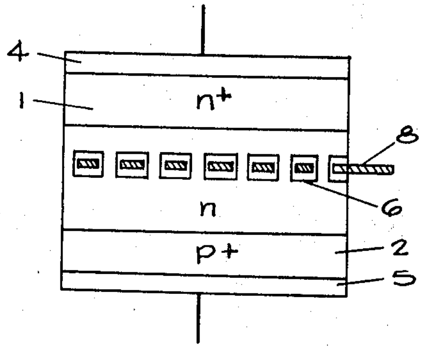

Another example is shown in FIG. 2, where only a single grid 6 is provided in the $n$ region. This suffices to achieve a similar effect, because with negative charging, the $n$ region in the immediate vicinity of the control grid becomes free of free electrons i.e. acts as an insulator.

Figure 3:
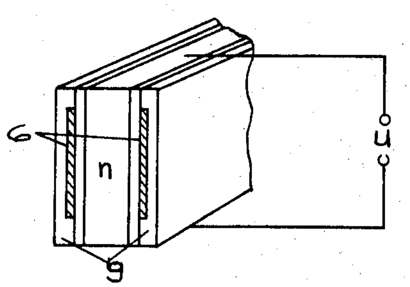

FIG. 3 shows a so-called field effect transistor for heavy currents which previously could not be realized (see Elektronics 1965, volume 5, page 139). As an example, an $n$-type semiconductor is used, which acts as current channel and to the end of which a voltage source U is connected. On the surface of this channel lie metal foils 6 embedded in insulating material 9. These are also under voltage and produce in the channel an electrical field which allows a space charge to occur. This acts either to prevent or to assist current flow.

Figure 4:
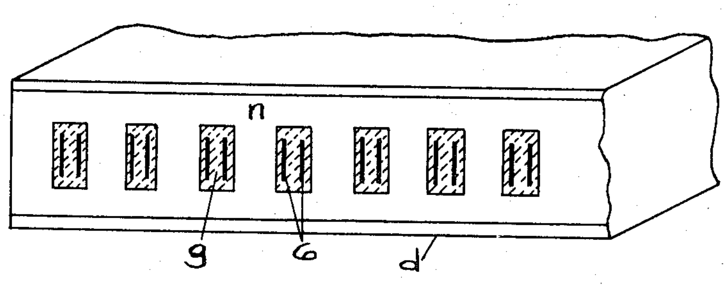

FIG. 4 shows an assembly of several such elements $s$ and $d$ showing where the external voltage source is connected (source and drain). The passage of current is influenced by the control electrodes 6.

Figure 5:
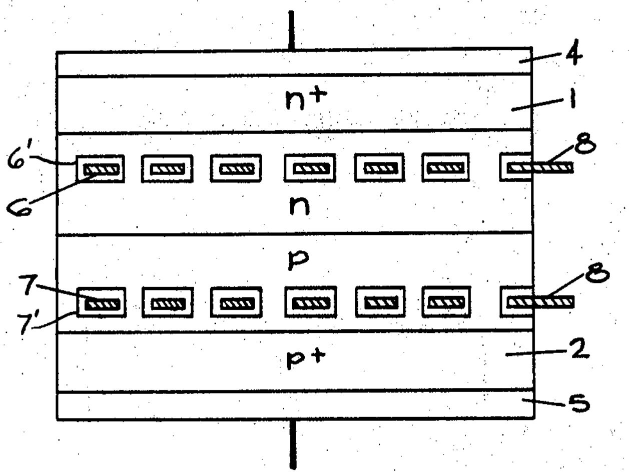

In FIG. 5 a further embodiment is shown, in which the $pn$ junction lies between two grids 6, 7. This has the advantage that the $pn$ junction lies in parts which are not affected by the embedding of the grid. As will be made clear later in the description of the method for producing these semiconductor devices, the grids lie on a monocrystalline layer, whereas they are not covered with fully monocrystalline material. The $pn$ junction is, however, very uniform in the monocrystalline part.

It is possible, instead of silicon oxide layer type semiconductor material, to use $p$-type semiconductor material for embedding the grid. This simplifies manufacture. It should also be mentioned that the same effect is obtained by the metallic insert pieces if, in the examples shown, the *n*-type layers are interchanged with the *p*-type layers.

Figure 6:
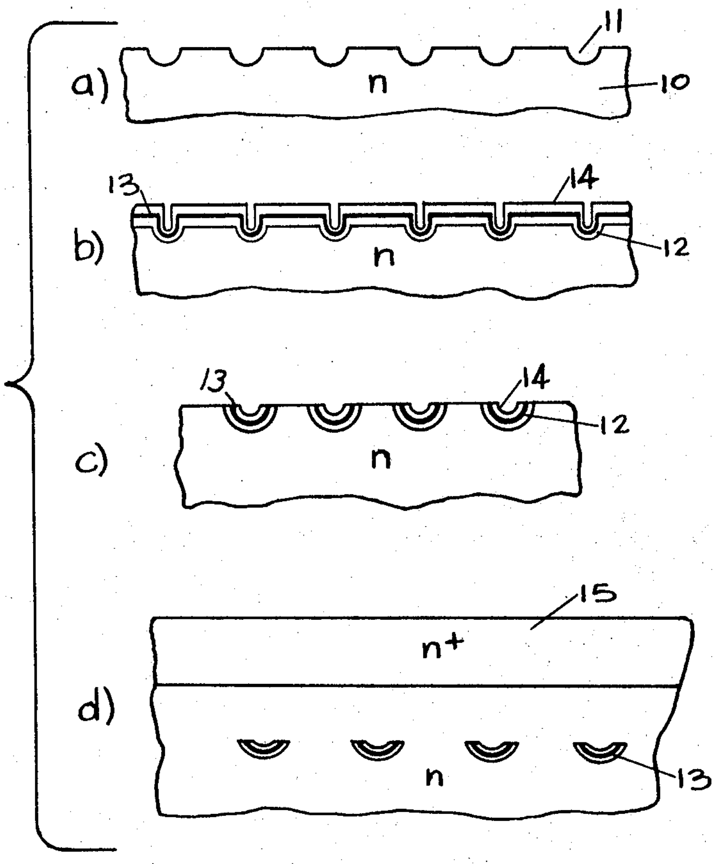

The manufacture of such semiconductor devices will be explained with reference to FIG. 6*a* to 6*d*. FIG. 6*a* shows a substrate 10, in which the grid is to be embedded. It consists of monocrystalline semiconductor material, for instance silicon. On this a mask is placed, and silicon is vapor deposited to produce for instance the shape known in FIG. 6*a*. The depressions 11 result from the mask and correspond to the grid structure of the metal grid. The mask is then removed and the silicon surface oxidized in known manner. Then metal, and on it silicon, are vapor deposited and oxidized to produce the structure of FIG. 6*b*, in which the silicon oxide is shown at 12, the metal at 13 and the overlying silicon oxide at 14. Then the surface is ground off, so that the structure of FIG. 6*c* is obtained. As FIG. 6*d* shows, silicon is again vapor deposited at 15; this layer must be so highly doped that more charge carriers are available than are lost by the recombination as a result of the current passing through. This layer does not have to be monocrystalline. Preferably the periphery of the mask is smaller than that of the wafer so that a metal-free rim remains round the periphery of the wafer.

The arrangements described and shown and the method of manufacture lead to semiconductor devices in which the propagation speed of the control effect is very great, and which can be produced with comparatively simple means. The current loading can be higher than with the known devices.

I claim:

1. A semiconductor device for controlling power currents comprising in combination a wafer of semiconductor material, electrodes contacting the opposite faces of said wafer, said wafer including a region of *n*-type material adjoining a region of *p*-type material thereby to establish a *p*-*n* junction therebetween parallel to said electrodes, at least one of said regions being subdivided into two adjoining layers parallel to said electrodes having higher and lower doping concentrations respectively, said layer having the higher doping concentration being in contact with one of said electrodes, and at least one metallic control grid embedded in and electrically isolated from said layer having the lower doping concentration for controlling the passage of power currents through said device.

2. A semiconductor device as defined in claim 1 for controlling power currents, wherein said wafer of semiconductor material comprises in succession, a highly doped $n^+$-type layer, a lower doped *n*-type layer and a highly doped $p^+$-type layer, and wherein said metallic control grid is embedded in and electrically isolated from said lower doped *n*-type layer in the vicinity of the adjacent highly doped $n^+$-type layer.

3. A semiconductor device as defined in claim 2 for controlling power currents and which further includes a second metallic control grid embedded in and electrically isolated from said lower doped *n*-type layer in the vicinity of the adjacent highly doped $p^+$-type layer.

4. A semiconductor device as defined in claim 1 for controlling power currents wherein said wafer of semiconductor material comprises in succession a highly doped $n^+$-type layer, a lower doped *n*-type layer, a lower doped *p*-type layer and a highly doped $p^+$-type layer, a first metallic control grid embedded in and electrically isolated from said lower doped *n*-type layer, and a second metallic control grid embedded in and electrically isolated from said lower doped *p*-type layer.